United States Patent [19]

Cedrone

[11] Patent Number: 4,747,784

[45] Date of Patent: May 31, 1988

[54] CONTACTOR FOR INTEGRATED CIRCUITS

[75] Inventor: Nicholas J. Cedrone, Wellesley Hills, Mass.

[73] Assignee: Daymarc Corporation, Waltham, Mass.

[21] Appl. No.: 864,293

[22] Filed: May 16, 1986

[51] Int. Cl.$^4$ ............................................. H01R 23/72
[52] U.S. Cl. ................................. 439/71; 324/158 F; 439/620; 439/912
[58] Field of Search .......... 339/17 CF, 14 R, 108 TP, 339/154 R, 154 A, 156 R; 324/158 P, 158 F, 73 PC; 439/68–73, 620, 912

[56] References Cited

U.S. PATENT DOCUMENTS

| | | | |
|---|---|---|---|
| 3,587,029 | 6/1971 | Knowles | 439/607 |
| 4,356,532 | 10/1982 | Donaher et al. | 174/52 FP |
| 4,415,216 | 11/1983 | Narozny | 439/497 |
| 4,473,798 | 9/1984 | Cedrone et al. | 439/912 |
| 4,560,216 | 12/1985 | Egawa | 439/41 |
| 4,564,251 | 1/1986 | Hansen et al. | 324/158 F |

OTHER PUBLICATIONS

IBM Bulletin, Barkhuff, vol. 19, No. 2, p. 467, 7-1976.
IBM Bulletin, Valentine, vol. 20, No. 11B, p. 4797, 4-1978.

Primary Examiner—Neil Abrams
Attorney, Agent, or Firm—Wolf, Greenfield & Sacks

[57] ABSTRACT

A contactor assembly for rapidly and repeatedly electronically testing surface-mounted integrated circuits (IC's), in conjunction with a test handler. The contactor assembly has rows of flexible, slightly bent, cantilevered contacts which are deformed into a plane parallel to the device when undergoing the electronic test. A conductive plate or plates including a capacitor or capacitors is positioned parallel to and closely spaced from the device under test ("DUT"). The capacitor is a decoupler and acts to minimize ground noise during current surges. Ground cables interleaved with signal cables, and in some embodiments the signal lines interacting with other elements of the assembly, cooperate to produce generally "characteristic" (purely resistive) impedance to a fast rising test signal. The assembly may include a plug which fits into a socket designed for the DUT.

2 Claims, 5 Drawing Sheets

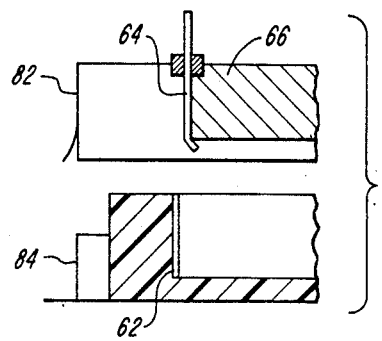
FIG. 11
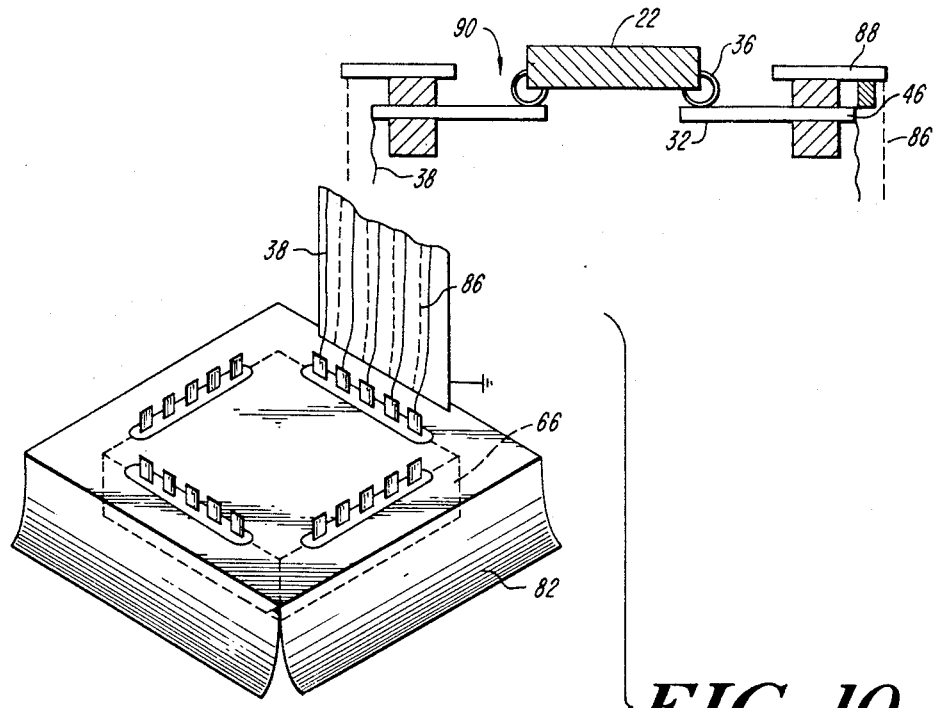
FIG. 12
FIG. 10

CONTACTOR FOR INTEGRATED CIRCUITS

BACKGROUND OF THE INVENTION

This invention relates in general to testing apparatus for electronic devices such as integrated circuits ("IC's"). More specifically, it relates to: (i) an electrical contactor assembly that is generally frequency insensitive to allow broadband testing with fast rising signals, and (ii) an interface for interchangeably connecting such an electrically contacting assembly to testing circuitry.

In the manufacture and use of IC's packaged as surface mounted devices ("SMD's"), it is important to test the devices accurately, reliably, and at a high rate. Automatic testing and handling machines that can perform this task are available. Such apparatus suitable for testing SMD ICs are sold by the Daymarc Corporation, Waltham, Mass., under the trade designation Model 757. In one common type of SMD device, a PLCC packaged IC, the circuit is contained in a molded plastic body having a generally rectangular, planar, box-like configuration. SMDs typically include either two rows of contacting leads along opposite and parallel sides of the body, or four rows of contacting leads, one along each side of the body. The most common configurations of SMDs include four rows of connecting leads. In any event, the leads lie generally in a common connecting plane.

An SMD is designed to be mounted directly on the surface of a circuit board or within a suitable receiving socket. The SMD can be distinguished from dual-in-line packaged (DIP) integrated circuits in that DIP devices are intended for mounting with leads passing through the circuit board (or within a suitable socket) rather than for surface mounting. Additionally, DIP's typically include only two rows of parallel connecting leads, in contrast to the usual four-row SMD.

Prior-art SMD testing apparatus can generally be described as either manual or automatic. In a manual apparatus, an operator manually places each SMD into a socket, conducts the test, then removes the SMD. In addition to being an obviously slow and time-consuming procedure, the sockets tend to wear out rapidly. A typical life is only a few thousand devices. Replacing a socket requires de-soldering the old one and installing a new socket.

A manual testing apparatus, however, using a socket mounted directly the test circuit board is advantageous in that testing is done in the electro-magnetic environment of actual use. While automatic apparatus have proven to be fast, they test the SMD at a remote location from the test circuit, and thus in an inappropriate environment. As an example of the importance of proximity to the test circuit, it is known that merely changing the lead length in the test situation from the actual use situation by a quarter of an inch can lead to substantial changes in electrical response.

SMD leads tend to be very soft or delicate. A force component as small as a few grams in a direction parallel to the plane of the SMD can damage the leads. A single lead damaged in testing can render the entire SMD unsuitable for use. In several known automatic testing apparatus, the testing contacts exert a side-acting force which permanently displaces the lead causing lateral or longitudinal row misalignment. Other prior art devices used sloped surfaces to guide the SMD into test position. Depending on factors such as the extent of misalignment, such guidance mechanisms can also misalign the leads.

As described in U.S. Pat. No. 4,473,798 to Cedrone et al, the testing of integrated circuits frequently requires that the test signal be "fast-rising", that is, a signal which is a very steep, step-like increase in potential. A typical fast-rising signal may be characterized by a voltage change of 1 volt per nanosecond. Such a signal can be represented through Fourier Series analysis as being composed of a multitude of superimposed sine waves having a very high frequency, typically on the order of 300 MHz. The fast-rising signal launched by the test circuitry and carried by the contacts to the device therefore behave in the manner of a high frequency signal.

With such high frequency "components" in the signal, the inherent inductance of the contacts themselves becomes a problem. Inductive reactance $X_L$ produces distortions and reflections which degrade the quality and accuracy of the test. The inductance L of the contact is a function of the cross-sectional configuration of the conductor and its length. It increases directly with the length and inversely with the cross-sectional width. Since the inductive reactance $X_L = 2\pi fL$, for the very high frequencies f associated with a fast-rising signal, the inductive reactance associated with even the relatively short contacts in normal use becomes a significant source of distortion and limits the accuracy of measurements.

One possible solution would be to increase the width of the contacts. However, the physical constraints of the test environment limit the available dimensions of the contacts. For example, the contacts must be separated laterally from adjacent contacts while each still maintaining a unique association with one lead on the SMD. Also, the contacts elastically deform during a test and must be sufficiently thin to flex repeatedly without exhibiting fatigue. Another possible solution is to make the contacts shorter. This is difficult to execute in testing DIP ICs, and in testing SMDs while the contacts can be made short comparted to those in DIP contactors, the signal path from the contacts to the test circuit is long enough to affect signal integrity adversely.

Still another possible solution is simply to test each device more slowly to wait for distortions and reflections to die out. With many modern SMDs such as large gate arrays, however, the speed of operation of the device itself is so fast that if the testing operation were to extend over a sufficient period of time to allow distortions and echos induced by the fast-rising testing signal to subside, then the speed rating of the devices could not be determined. In short, the testing operation must have a speed on the order of the device function being tested. At present, there is no satisfactory electrically contacting assembly for use with automated SMD testing and handling apparatus which can provide a reliable electrical connection between the SMD and the testing circuitry while avoiding the distortions, reflections and resulting uncertainty of the measurement when the SMD is tested with fast-rising signals, while at the same time avoiding lateral force components that can permanently misalign the SMD contacts.

Another consideration is minimizing "ground noise", that is, changes in the reference voltage due to current surges during the test procedure simulating operation of the device. A typical situation is a test where a change in the device state causes a current surge in the range of 20 milliamperes per nanosecond. Such a surge can cause the ground reference to move one volt or more thereby distorting measurements referenced to ground by 20% or more. The end result is that good devices may not pass the test and are downgraded.

It is therefore a principal object of the invention to provide a contactor assembly that maintains signal integrity even when testing SMD devices even when the testing involves fast-rising signals or current surges.

Another principal object of the invention is to avoid harm to the delicate SMD leads.

Another object of the invention is to provide a virtual ground for selected leads close to the SMD.

Yet another object is to provide a short signal path between the DUT and the test circuit.

Still another object is to provide an electro-magnetic testing environment that closely simulates that of the intended use.

A further object is to provide an assembly that allows convenient replacement of the contacts and convenient attachment to the test circuit thereby providing enhanced operational flexibility and reducing the required inventory of test components.

It is yet a further object to provide a testing system with the foregoing advantages that is generally simple, low cost, and of highly durable construction.

SUMMARY OF THE INVENTION

A system for testing IC's particularly SMD's, includes a contactor assembly having a base that supports rows of flexible electrical contacts extending from the base into a central window to a free end. The number and location of contacts is chosen to match the leads of the SMD. The free end of each contact is directed toward an incoming SMD moving along a direction Z that is generally perpendicular to the base and the contacts. When the SMD is inserted into the testing position, the contacts are deformed into a plane parallel to the seating plane of the SMD. Therefore, when the SMD is in the test position and the contacts are at their greatest deflection, the force exerted by each contact on each SMD lead has substantially no component of force lying in a plane parallel to that of the SMD.

Each contact has a small cross-section, is comparatively short, and is designed to conduct an electrical signal along its length from the test circuit to the IC. Each contact is structured to flex resiliently from a first non-testing position where the free end of the contact is, in a preferred form, bent into a slight angle with a plane parallel to the SMD to a second testing position where the free end is forced into electrical connection with the lead. Each contact passes through an insulating member forming a part of the base and has a free opposite end outside the insulating member.

Another important feature of the preferred embodiment of the present invention, is a decoupler plane or planes connected to selected contacts and very closely spaced from the SMD. This decoupler plane includes one or more co-planar or parallel planar, flat, relatively wide electrical strip connected to a device, preferably a chip capacitor. The decoupler plane is connected to selected contacts through curved arms and thus forms a "sling" beneath the SMD. There may be multiple planes and multiple arms to make any desired combination of connections via this decoupler assembly.

The contactor assembly may be installed in a conventional SMD receiving socket. Signal wires preferably connect the contacts to a set of strap contacts affixed to a plug. The plug and the strap contacts cooperate to have the geometry and contact arrangement of a SMD. In this manner, the entire contactor assembly allows the contactor to be used with existing test apparatus without modification of the apparatus.

In order to produce a characteristic impedance to a fast-rising test signal, electrical connection between the contacts and the plug is made principally with flat cable having alternating signal and ground wires. The contactor assembly locates the SMD very close to the test circuit (the width of the contactor assembly in the Z direction is small, typically approximately ¾ inch) which minimizes the effect of separating the DUT from the test circuitry. These features cooperate to subject the SMD to a very similar electro-magnetic environment to the environment of actual use.

A bell-mouth ground connector carries the ground past the SMD socket of the test circuitry and thereby continues the characteristic impedance over the plug and socket region to the interleaved signal and ground wires in the cable. A ground flange surrounds the socket and makes electrical contact with the bell mouth ground connector. Signal wires lead to the contacts from the test circuit. Ground cables may be interleaved between the signal wires. Additionally, a ground frame may be affixed about the contacts with ground wires connected to it to continue the characteristic impedance at the contacts. Auxiliary ground planes located near the signal wires can be used to adjust the impedance presented to a signal. Further, a chip capacitor may be connected between selected contacts and the ground plane to provide a virtual ground immediately at a selected lead. Still further, by disconnecting selected ones of the ground wires it is possible to create a minimum capacitance to ground at selected leads.

To shield from electro-magnetic and radio frequency interference, (EMI/RFI), conductive shields may be applied external to the signal paths from the DUT to the test circuit.

These and other features and objects of the invention will be more clearly understood from the following detailed description of the preferred embodiments which should be read in light of the accompanying drawings.

BRIEF DESCRIPTION OF THE DRAWINGS

FIG. 10 is a perspective view of one embodiment of connecting the contactor assembly to a test circuit.

FIG. 11 is a partial cross-sectional view of the embodiment of FIG. 10.

FIG. 12 is a cross-sectional view of one embodiment of the contactor assembly.

DETAILED DESCRIPTION OF THE PREFERRED EMBODIMENTS

Figures 1, 2:
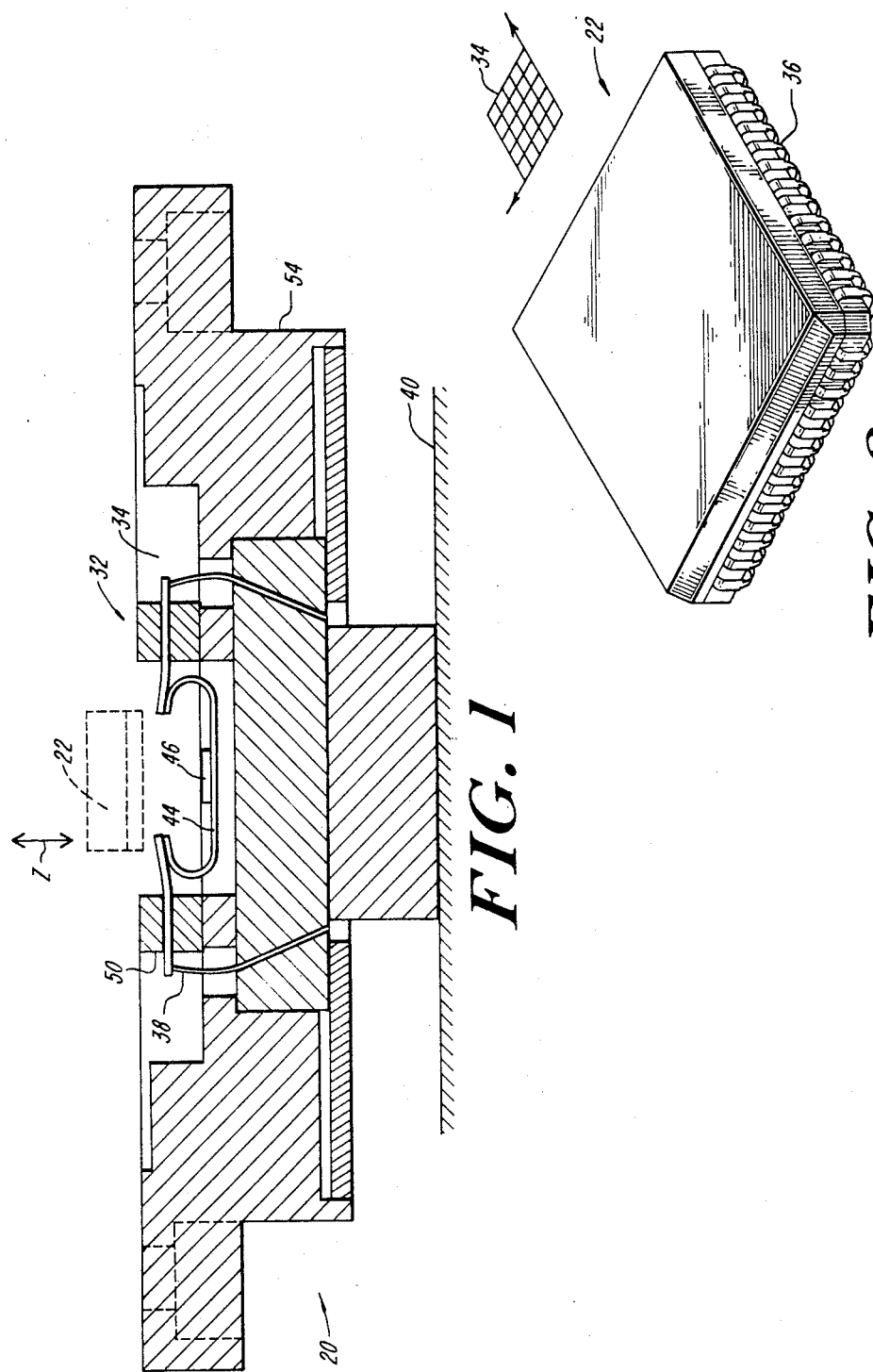
FIG. 1 is a cross-sectional view of a contactor assembly in accordance with the present invention.
FIG. 2 is a perspective view of an SMD of the type tested in the present invention.
Figure 3:
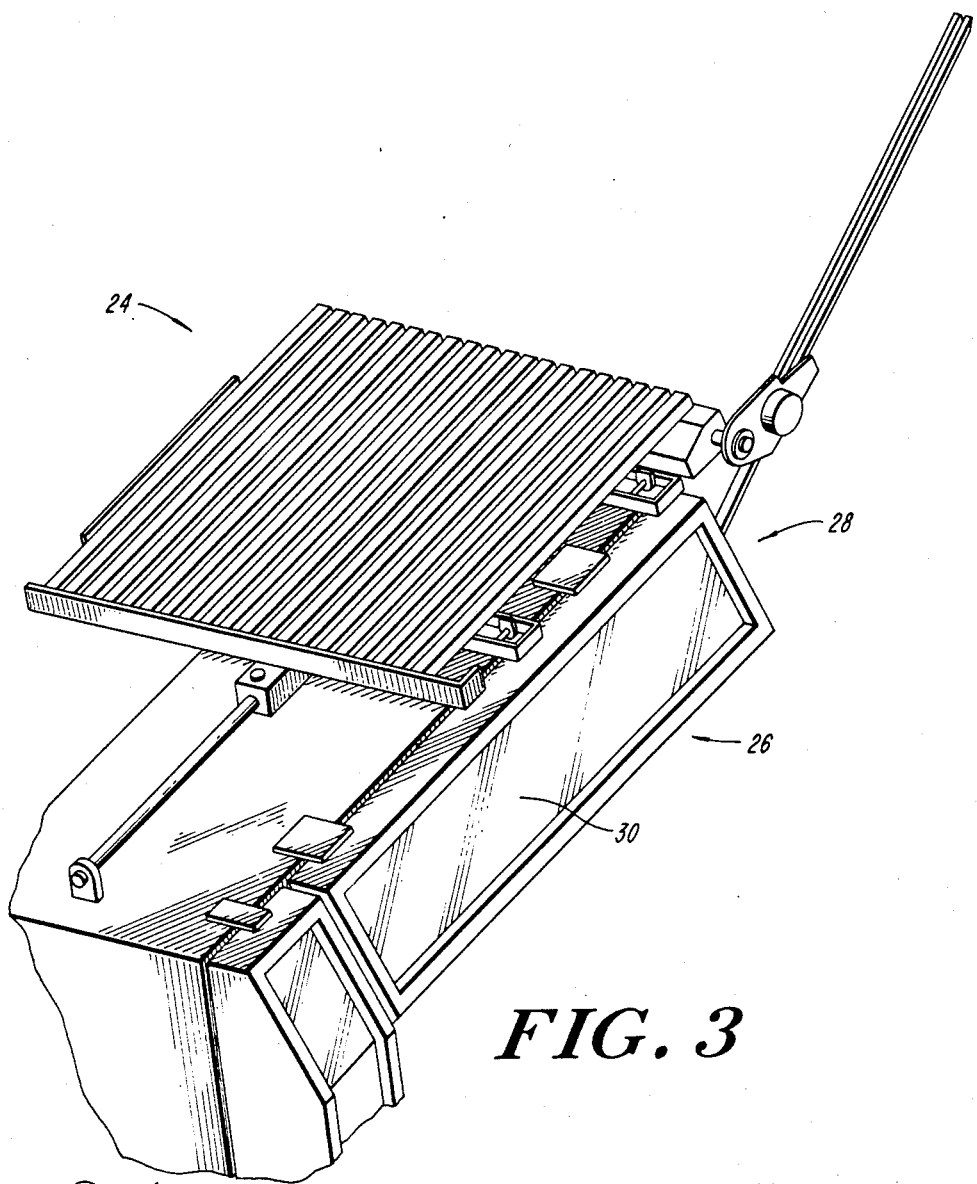
FIG. 3 is a partial perspective view of a test handler/sorter in which the present invention may be used.

With reference to FIGS. 1, 2 and 3, a contactor assembly 20 for testing SMDs 22, is particularly adapted for use in combination with a model 757 test handler/sorter 24 manufactured and sold by Daymarc Corporation. This is a high-speed machine with an initial storage unit 26 that receives SMDs at the input 28, stores them for an interval of time in a heat-soak region 30 to allow them to reach a desired temperature, and then tests them. The contactor assembly is located at a test site indicated generally by A. The transporter assembly 15 carries the SMDs from the storage unit 30 to the test site A.

Figure 4:
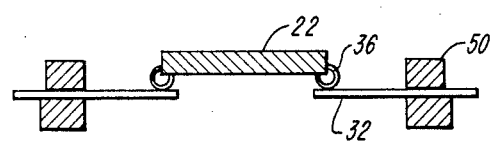
FIG. 4 is a cross-sectional view of a SMD in electrical contact with the contacts.

The contactor assembly 20 includes rows of highly conductive resilient and comparatively short contacts 32, shown in their normal unflexed position in FIG. 1. The contacts 32 are generally slightly bent upwardly toward an "incoming" SMD 22 from a plane parallel to the seating plane of the SMD indicated as 34. Besides being formed of a highly conductive material, the contacts 32 are also formed of a material which is resilient and resistant to material fatigue during cycled flexures to and from a testing position shown in FIG. 4. In the testing position, the contacts 32 are deformed into a plane generally parallel to the SMD 22. Each contact conducts a signal along its length from an SMD lead 36 through signal wires 38 to a testing circuit indicated generally by 40.

Typically the SMDs 22 are tested in systems where the characteristic impedance of the system is in the range of 50–100 ohms. The contactor assembly 20 of the present invention therefore preferably has components that are structured and located with respect to the contacts 32 to produce a characteristic impedance with a matching value.

Figure 5:
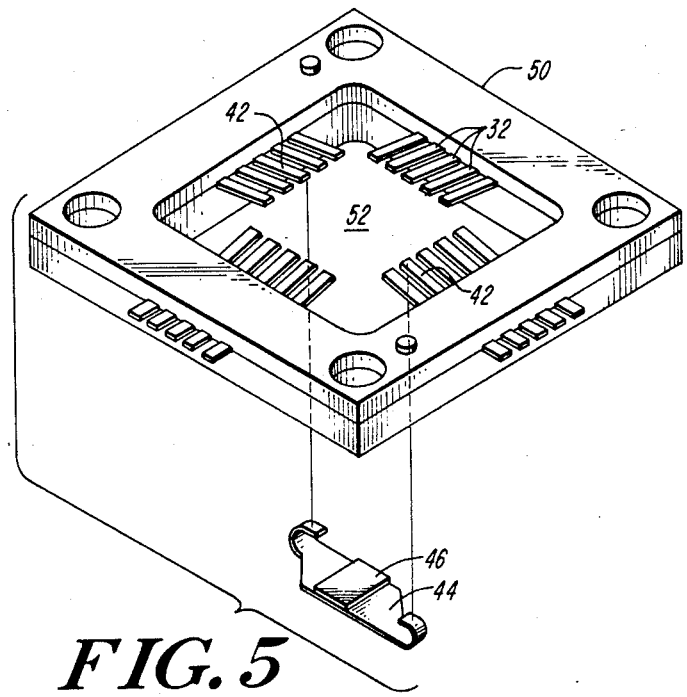
FIG. 5 is a perspective exploded view showing assembly of a decoupler plane to the contacts.
Figure 6:
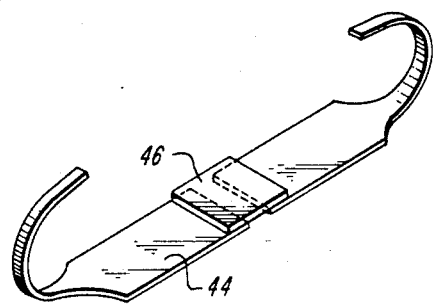
FIG. 6 is a perspective view of a decoupler plane.
Figure 6A:
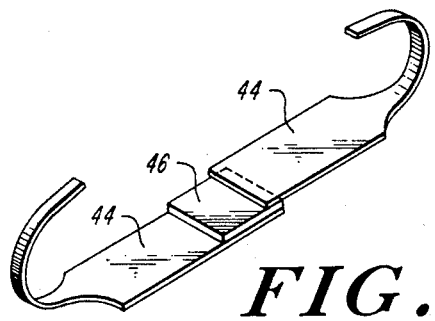
FIG. 6A is a view corresponding to FIG. 6 of an alternate embodiment.
Figure 7:
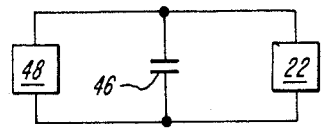
FIG. 7 is a circuit schematic for the capacitor chip on the decoupler plane.

Another significant feature of the contactor assembly according to the present invention is that selected contacts 32 are soldered to a conductive decoupler plane 44 including an electronic device, typically a chip capacitor 46 as shown in FIGS. 1, 5 and 6. This decoupler is useful for testing the operation of the SMD in response to a large current surge. The function of the chip capacitor 46 is best seen with reference to FIG. 7. The circuit is represented by the reference numeral 48. The SMD 22 appears as a load with the capacitor 46 connected in parallel with the load. Because the capacitance stores energy the capacitor "decouples" selected test lines from the source of power. Stated in other words, the capacitor 46 acts as a local reservoir to provide current surges demanded by the SMD.

The capacitor 46 is slung directly beneath the SMD under test. This location has the advantage of placing the capacitor very close to the SMD to duplicate the preferred relation between a decoupling capacitor and the DUT as actually used in the final application.

Figure 8:
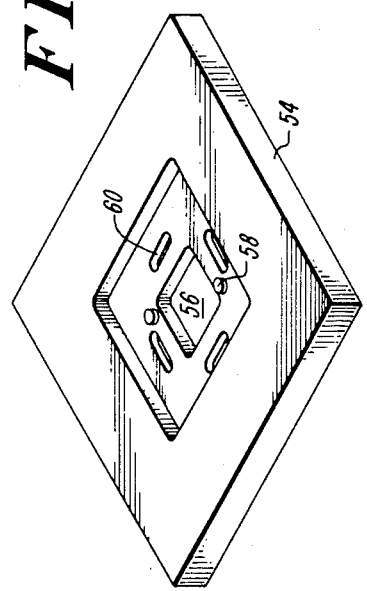
FIG. 8 is a perspective view of the contact block.

As shown in FIGS. 1 and 5, the contactor assembly 20 includes a contact support member 50, made of insulating material, which has a window 52 into which the contacts 32 extend. The contacts pass through the contact support member 50 and protrude to a free end outside the support member. The contact support member 50 fits on a contact block 54, made of insulating material. An alternative embodiments of the contact block 54 are shown in FIG. 8. Each contact block has a central window 56, which corresponds to the window 52 of contact support member 50. A pair of locating pins 58 ensure proper alignment of the contact support member 50 to the contact block 54. Each contact block also includes four elongated windows 60, symetrically located about the central window 56. As will be explained more fully hereinafter, the elongated windows 60 permit passage of signal cables from the contacts 32 to the test circuit indicated generally at 40.

Figure 9:
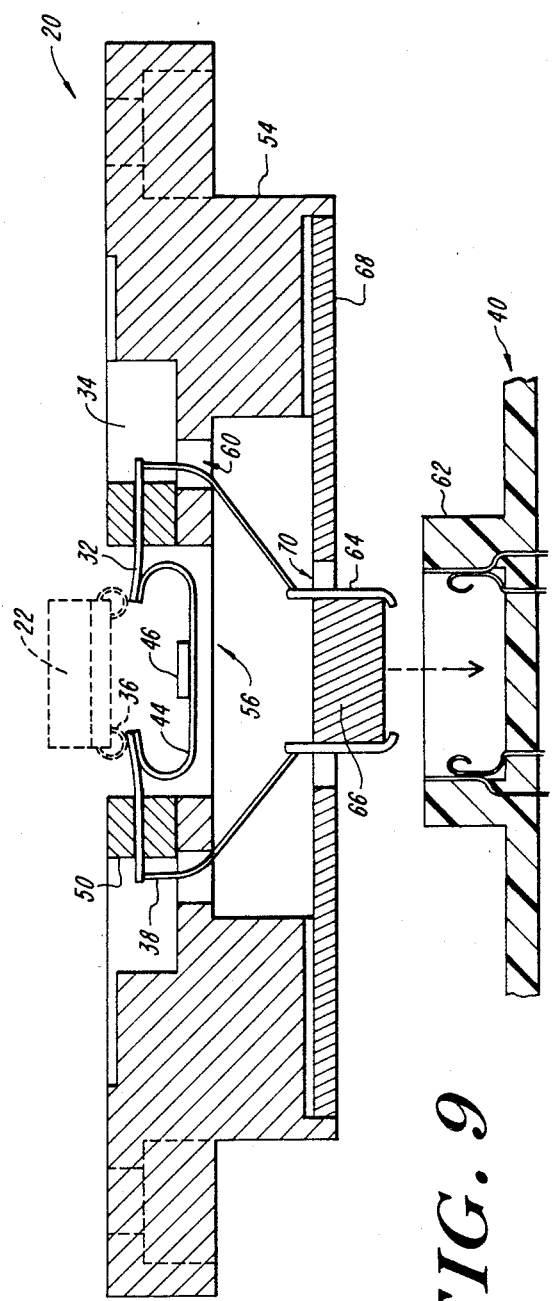
FIG. 9 is a cross-sectional view of a contactor assembly prior to installation in a socket in the test circuit.

Referring now to FIG. 9, the contactor assembly 20 is shown prior to installation in a socket 62 in the test circuit 40. The socket 62 is a conventional SMD receiving socket which may be a socket designed for receiving the SMD 22. The signal wires 38 connect the contacts 32 to a set of strap contacts 64 affixed to a plug 66 made of insulating material. The signal wires 38 are soldered to the contacts 32 and the strap contacts 64. The plug 66 forms the central portion of a lower base member 68. The lower base member 68 has elongated windows 70 symetrically located around the plug 66, which permits the strap contacts 64 to pass through the lower base member 68. The plug 66 and the strap contacts 64 cooperate to have the geometry and contact arrangement of an SMD. Thus, the contactor assembly 20 may be used with existing manual test set-ups.

The SMD 22 undergoing the test (the DUT) is removed a small distance along the Z direction from the test circuit 40, however, this invention minimizes the electrical effects of this removal from the actual operating environment by the distance Z.

In one embodiment, illustrated by FIG. 10, a bell mouth ground connector 82 acting in combination with the signal carrying conductors, continues the characteristic impedance signal transmission through the plug and socket region. The bell mouth ground connector 82 encloses the plug 66 shown here in phantom. A ground flange 84 surrounds the socket 62 and makes electrical contact with the bell mouth ground connector 82. The manner of connecting the plug 66 to the socket 62 with the bell mouth ground connector 82 and the ground flange 84 can also be seen from FIG. 11. Since grounds shields are frequently used under actual operating conditions, the bell mouth ground connector 82 allows testing under similar electrical conditions.

The signal wires 38 lead to the contacts 32. One or more ground cables 86, shown as dashed lines for clarity, may be soldered to the bell mouth ground connector 82.

Referring now to FIG. 12, the ground cables 86 are soldered to a ground plane 88. The ground plane 88 is affixed to the outer surface of the contact support member 50, and includes a central window 90, which is large enough to permit passage of the SMD22 without the SMD leads 36 interacting with the ground plane 88.

The ground cables 86 and the signal wires 38 may be interleaved in the manner shown in FIG. 10. The distributed capacitance between the signal wires and the adjacent ground wires offsets the inductive reactance of the signal wires themselves resulting in a substantially resistive impedance. In this manner, the signal transmitted over the signal wires 38 encounters a characteristic impedance to a fast-rising test signal.

Thus, it can be seen that the objects of the invention have been met in that there has been disclosed a system for testing SMD-type ICs that provides a contactor assembly, which provides a decoupling capacitor close to the DUT and also provides a virtual ground for selected leads closely spaced to the SMD, which transmits fast-rising test signals with substantially charasteristic impedance, which provides an electromagnetic testing environment that simulates the environment of intended use, that allows convenient replacement of the contacts and convenient attachment to the test circuit, and is of a generally simple, low cost design and of highly durable construction.

While the present invention is described with respect to the transporting and testing of SMD-type ICs, it is not limited to these devices. The invention would similarly be useful for other integrated circuits having similar operating characteristics or requirements.

What is claimed is:

1. A contactor assembly for establishing an electrical connection between a test circuit of a high speed automatic test handler and a succession of integrated circuits (IC'S) each having a generally planar body and a plurality of leads extending from at least one side of said body comprising:

an insulating base have a central recess dimensioned to receive the IC under test at a seating plane within the recess without physical contact between the IC and the contactor assembly to avoid damage to the leads, the base extending generally along a first plane but having a thickness in a direction Z perpendicular to said first plane measured between the seating plane and the test circuit which places said IC in sufficient physical proximity to said circuit to closely simulate the electro-magnetic environment of said IC in said circuit, a plurality of contacts each mounted at a fixed end to said base with a free end projecting into said recess and positioned to make electrical connection at the seating plane with an associated lead of the IC, said contacts being directed along said Z direction sufficiently that when the IC under test is positioned at the seating plane for testing said contacts deflect to a position where they exert substantially no force on the leads in a direction lying in said first plane, a substantially characteristic impedance path connecting at least one of said contacts with said test circuit, and electrical decoupling means closely spaced from said IC under test, said decoupling means including at least one conductor plate having at least two arms connected to the free ends of selected ones of said contacts and including at least one capacitor electrically connected by said at least one plate between said selected contacts.

2. The contactor of claim 1 wherein said characteristic impedance path includes a cable with interleafed signal and ground wires and a bell mouth ground connector secured to said insulating base and facing said test circuit, a ground flange mounted on said test circuit, said bell mouth ground connector fitting about said ground flange, a ground frame mounted on said insulating base adjacent and closely spaced from said plurality of contacts to provide a distributed capacitance with respect to the adjacent portions of said contacts that produces said substantially characteristic impedance path over said adjacent contact portion, and said ground frame being electrically connected to said bell mouth ground connector by said ground wires.

* * * * *